United States Patent [19]
Barker

[11] 4,246,538
[45] Jan. 20, 1981

[54] METHOD OF INVESTIGATING THE ELECTRICAL RESISTIVITY OF THE GROUND AND APPARATUS FOR USE IN THE METHOD

[76] Inventor: Ronald D. Barker, 4, Hayfield Rd., Moseley, Birmingham, West Midlands, England

[21] Appl. No.: 948,025

[22] Filed: Oct. 2, 1978

[30] Foreign Application Priority Data

Feb. 10, 1977 [GB] United Kingdom ............... 45147/77

[51] Int. Cl.³ ............................................... G01V 3/00
[52] U.S. Cl. ..................................... 324/347; 324/323
[58] Field of Search ........................ 324/1, 9, 347, 323

[56] References Cited
U.S. PATENT DOCUMENTS 2,192,404  3/1940  Jakosky .................................. 324/9
2,885,633  5/1959  Cook ...................................... 324/9

Primary Examiner—Michael J. Tokar
Attorney, Agent, or Firm—Klarquist, Sparkman, Campbell, Leigh, Hall & Whinston

[57] ABSTRACT

In a method of investigating the electrical resistivity of the ground, five electrodes are implanted in the ground at equal spacings along a straight line. An electrical current is passed through the ground between one pair of these electrodes and the potential difference between a further pair of the electrodes is measured. The electrode which is not used in this measurement is at one end of the line. A further measurement is then made with the four electrodes which exclude the electrode at the opposite end of the line. The measurements are combined to provide a measurement of apparent resistivity which is almost unaffected by a local resistivity variation.

10 Claims, 5 Drawing Figures

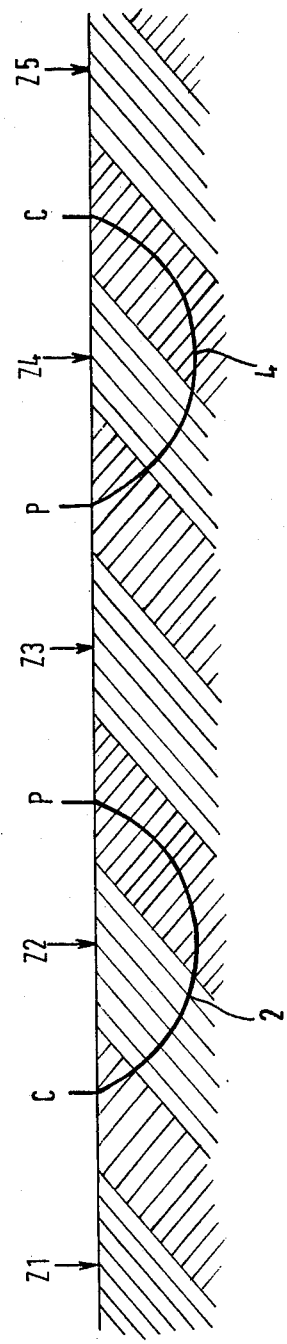

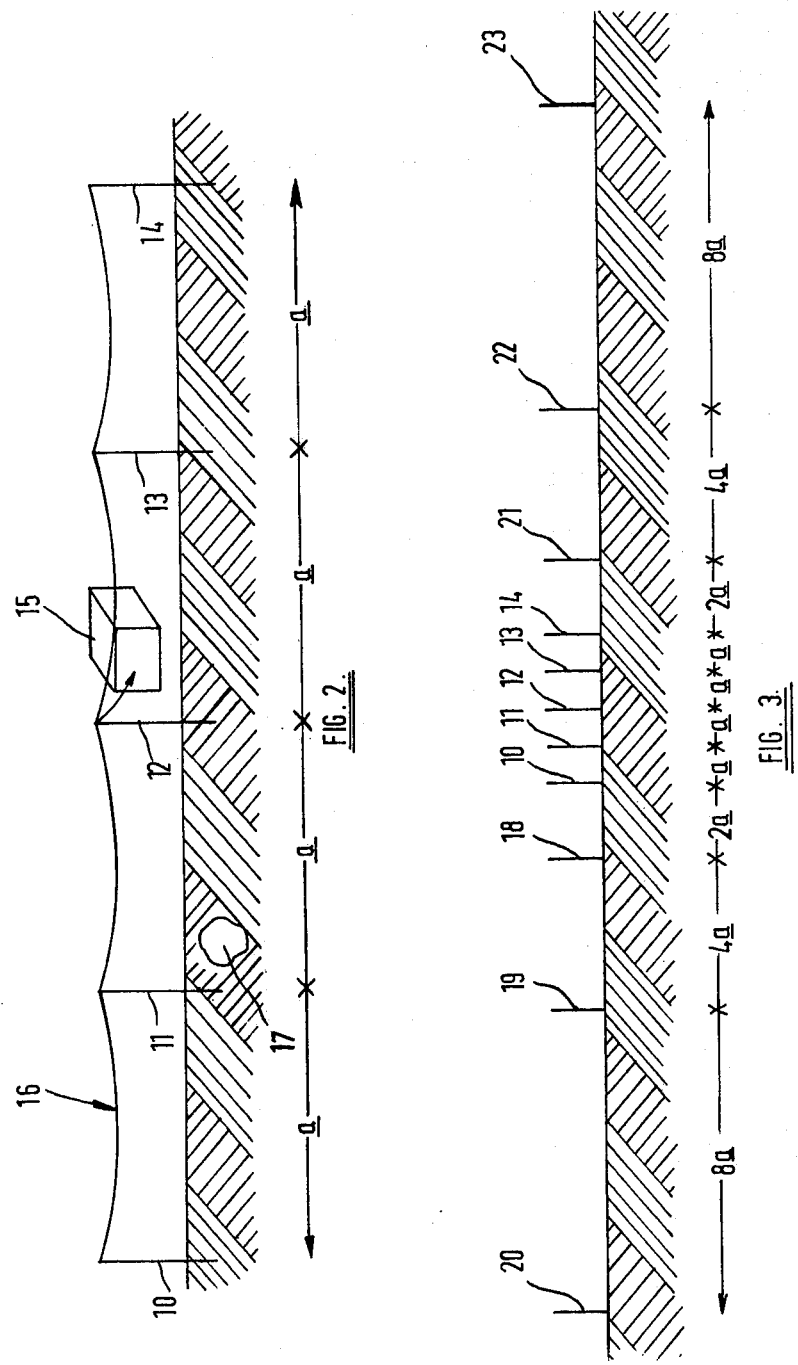

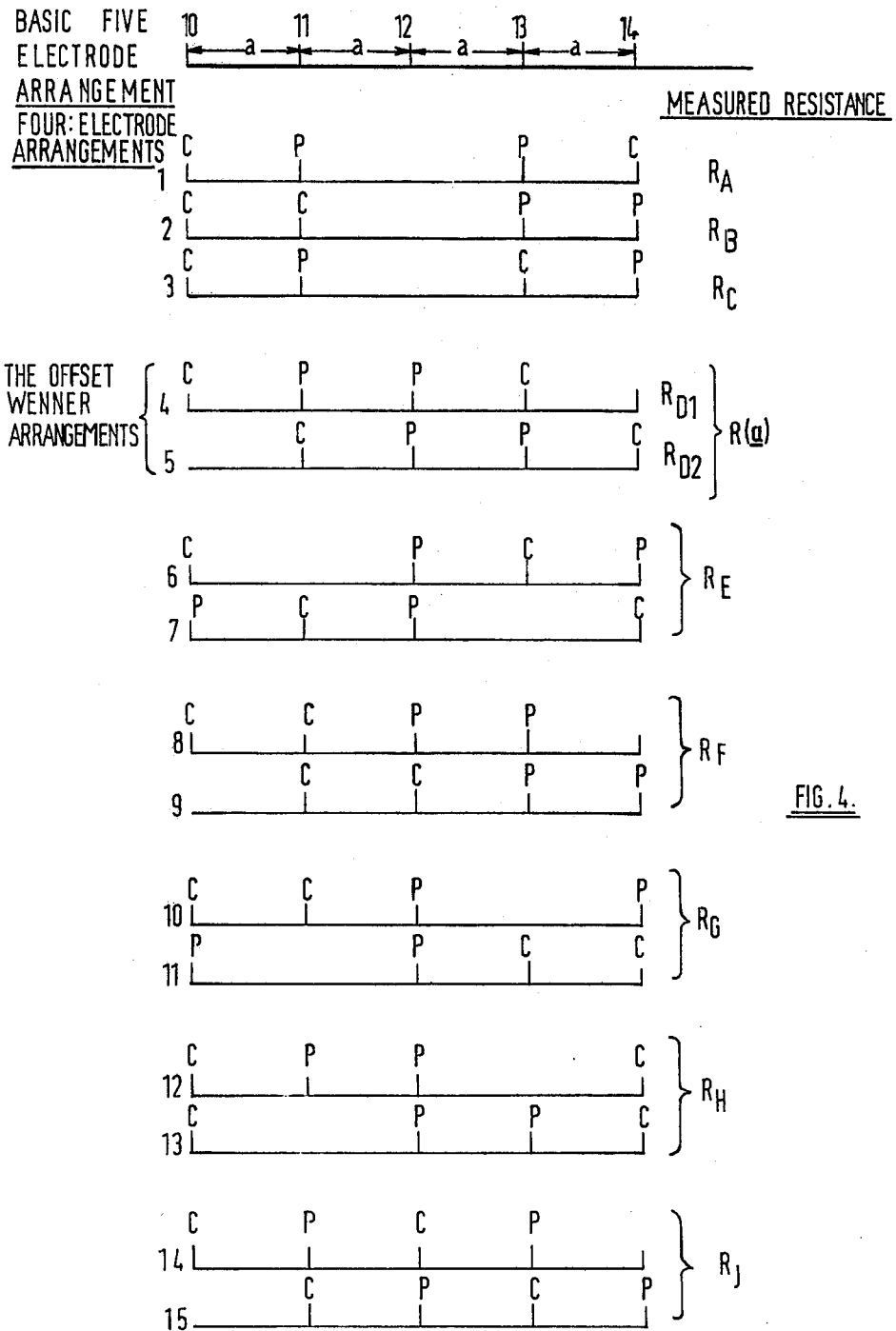

METHOD OF INVESTIGATING THE ELECTRICAL RESISTIVITY OF THE GROUND AND APPARATUS FOR USE IN THE METHOD

BACKGROUND OF THE INVENTION

This invention relates to a method of investigating the electrical resistivity of the ground wherein an electrical current is passed through the ground between a first pair of positions (called herein "current electrode positions") and a measurement is made of the resulting potential difference between a further pair of positions (called herein "potential electrode positions"). Such a method is hereinafter called "an electrical resistivity method". The invention also relates to apparatus for use in the method.

In one known electrical resistivity method, the potential electrode positions lie on a straight line between the current electrode positions and the three spaces between adjacent electrode positions are all equal. This is known as the Wenner electrode arrangement. A series of determinations of electrical resistivity are made with the same electrode arrangement but with different electrode spacings. The values of electrical resistivity which are found are used to plot a curve showing the relation between apparent resistivity and electrode spacing. This curve can be interpreted in terms of horizontal sub-surface strata of different resistivities and this method is one example of an electrical sounding method. Electrode arrangements other than the Wenner electrode arrangement are used in other electrical sounding methods.

Measurements made by the known electrical resistivity method hereinbefore referred to can be affected by the presence of local resistivity variations. By "local" I mean herein variations which are significant only in a region near to the electrodes. The distance across the region in which the variations is significant is not greater than twice the distance between the electrodes which are furthest apart.

One disadvantage of the known method hereinbefore described is that the potential difference measured between a particular pair of potential electrode positions can be affected by a local resistivity variation which arises from the presence in the vicinity of the electrode positions of a sub-surface mass of material which has electrical properties different from those of the stratum containing the mass. The relationship between the electrode spacing and the apparent resistivity which is calculated from such an affected potential difference measurement will not be repesentative of the strata under investigation and will mislead the investigator.

The effect on the potential difference measured may be a positive one, by which I mean that the apparent resistivity calculated from the affected measurement is greater than the apparent resistivity which would be found if the stratum in which the mass occurs is substantially homogeneous. Alternatively, the effect on the potential difference measured may be a negative one, by which I mean that the apparent resistivity calculated is smaller than the apparent resistivity which would be found if the stratum was substantially homogeneous. Whether the effect is a positive one or a negative one depends both upon the electrical properties of the mass and upon the position of the mass relative to the electrodes. In the vicinity of the electrodes there is a plurality of zones, five zones in the case of the Wenner electrode arrangement, and a mass which gives rise to a positive effect on the potential difference in one zone will give rise to a negative effect on the potential difference if the mass is in an adjacent zone.

SUMMARY OF THE INVENTION

According to a first aspect of the invention, I provide an electrical resistivity method wherein after the potential difference between a pair of potential electrode positions has been measured, a change is made in the electrode positions to change the character (as hereinafter defined) of at least one zone in the vicinity of the electrodes and a further measurement of potential difference is then made.

By the character of a zone is meant herein that positional relation between the zone and the electrode positions which determines whether a positive effect or a negative effect on the potential difference measured arises from the presence in the zone of a particular sub-surface mass having electrical properties which differ from those of the stratum containing the mass. When such a mass is present in a zone, the effect of the presence of the mass can substantially be eliminated from the calculated apparent resistivity if there are combined two measurements made respectively before and after a change in the character of the zone containing the mass.

Preferably, the electrode positions are at equal intervals along a straight line and the change made in the electrode positions is a shift of each electrode position by one such interval in the same direction along the line.

The middle pair of electrodes of each group of four may be used either as the current electrodes or as the potential electrodes. In these cases, if each electrode position is shifted in the same direction by the interval between adjacent electrodes, the character of each zone in the vicinity of the electrodes will be changed.

According to a further aspect of the invention, there is provided apparatus for carrying out the method according to the first aspect and comprising two sets of insulated electrical conductors, each conductor connecting a respective terminal to a respective tap, the terminals being mounted adjacent to each other on a support, the taps being movable away from the support and, in each of the sets, the respective lengths of the conductors from the terminals to the taps varying from one conductor to another and substantially forming a geometric progression.

If the conductors are extended along a straight line from the support, one set of conductors in each direction, and each tap is connected to a respective electrode positioned adjacent to the tap, the method in accordance with the first aspect of the invention can be repeated with different electrode spacings, without moving the electrodes from the positions in which they have been implanted in the ground. By a "tap" is meant herein any means for establishing an electrical connection between a conductor and an electrode. Such means may be a bare portion of the conductor but is preferably an electrically conductive device secured to the conductor and adapted for attachment to an electrode.

The apparatus may include a multi-pole multi-way electrical switch associated with the support and having inputs connected to the terminals of the conductors and outputs connected to a source of electrical current and to a potential difference measuring means.

BRIEF DESCRIPTION OF THE DRAWINGS

The invention will now be described, by way of example, with reference to the accompanying drawings wherein:

FIG. 1 shows diagrammatically a vertical cross section through the ground along a line which passes through four electrodes implanted in the ground and showing zones of different character in the vicinity of the electrodes.

FIG. 2 is a diagram similar to FIG. 1 illustrating an electrical resistivity method in accordance with the invention, FIG. 3 illustrates diagrammatically an arrangement of electrodes used for a series of electrical resistivity determinations in accordance with the invention, the series constituting an electrical sounding, FIG. 4 is a Table showing all possible combinations of four-electrode arrangements, and the corresponding resistance, which can be obtained with the five-electrode arrangement illustrated in FIG. 2.

DETAILED DESCRIPTION

Figure 5:
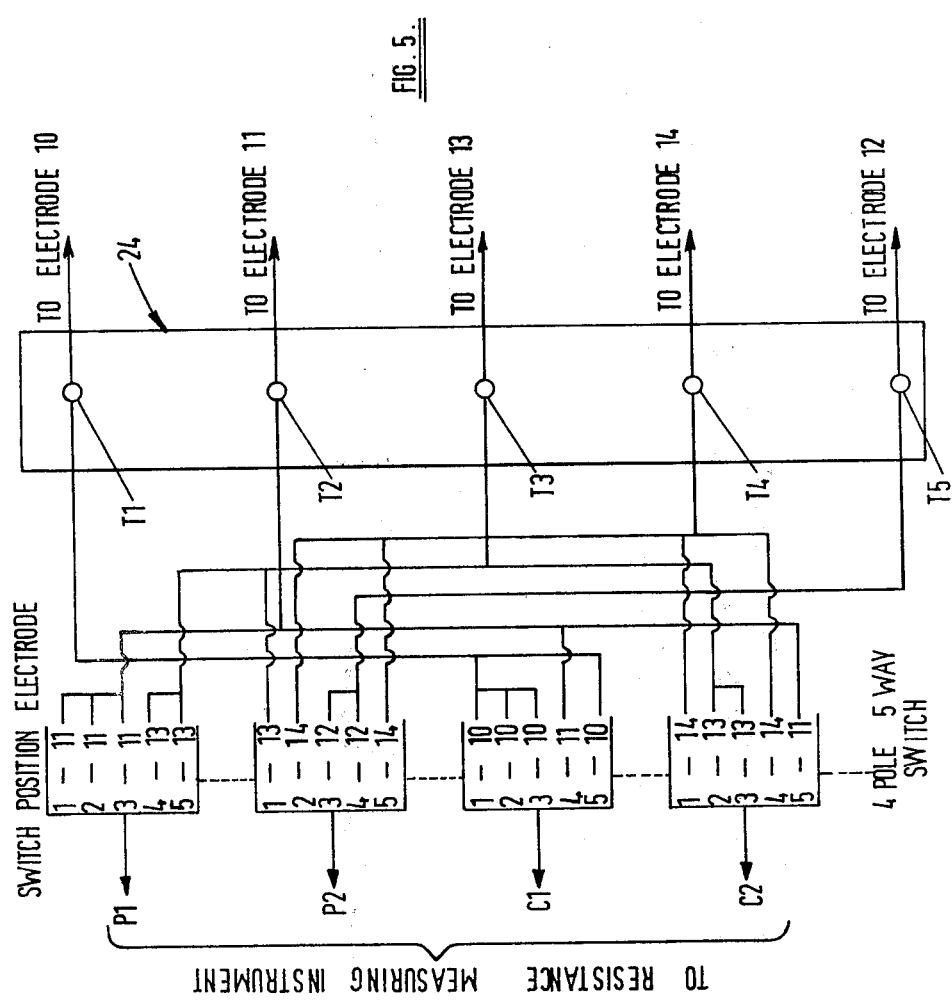
FIG. 5 is a diagram illustrating a part of an electrical circuit of apparatus used in the method illustrated in FIG. 2.

In the electrical resistivity method illustrated in FIG. 2, five electrodes are implanted in the ground at equal intervals along a straight line. The electrodes are indicated by the reference numbers 10 to 14. The electrodes are connected to a control box 15 by respective electrical conductors which are conveniently comprised by a multi-core cable 16. The control box contains a multi-pole, multi-way switch, a current source and means for measuring potential difference, for example a millivolt-meter. The current source may comprise an inverter which can be energised from a battery to provide an alternating current and at least the battery may be separate from the control box. The means for measuring potential difference may comprise a measuring instrument adapted to respond to the value of the potential difference and to the value of the current and to indicate to the user a corresponding value of electrical resistance.

By means of the multi-pole switch, current can be passed from the source through the ground between any selected pair of the electrodes 10 to 14 and, whilst the current is being so passed, the potential difference can be measured between either of the pairs of electrodes selected from the three electrodes not used for conducting current into or from the ground.

To determine the electrical resistivity of the ground by the method of the invention, the potential difference between the electrodes 11 and 12 is measured whilst a current is being passed through the ground between the electrodes 10 and 13. The earth resistance $R_{D1}$ is determined either by observation of the measuring instrument, where this is adapted to indicate values of resistance, or by calculation from values of current and potential difference.

By operation of the multi-pole switch, the current electrode positions at which the current enters and leaves the ground and the potential electrode positions between which the potential difference is measured are changed. Each position is shifted to the right, as viewed in FIG. 2, by the interval a between adjacent electrodes. A second determination of electrical resistance, $R_{D2}$ is then made. It will be noted that, in this particular example, both determinations of electrical resistance are made with the Wenner electrode arrangement.

If, unknown to the operator, the first determination of resistance was affected by a local resistivity variation, then the second determination of resistance will have been subject to a substantially equal but opposite effect by the local resistivity variation. If the first and second resistance values are combined, in this particular case by finding the average of the values, the effect of the local resistivity variation can substantially be eliminated. The average electrical resistance $R(a)$ is hereinafter called the "offset Wenner resistance". The apparent resistivity, $\rho(a)$ is computed from the relation $\rho(a) = 2\pi a R(a)$ where $R(a)$ is the offset Wenner resistance measured with electrode spacing $a$.

For example there may be in the region between the electrodes 11 and 12 a subsurface mass 17 having electrical properties which differ from those of the stratum containing the mass so that the value of the electrical resistance between the electrodes 11 and 12 which is determined differs from the value which would have been determined if the mass 17 was absent and the stratum was substantially homogeneous. If the effect of the mass 17 is such as to increase the value of electrical resistance determined between the electrodes 11 and 12 when the first measurement is made, then when the second measurement is made, the mass 17 will cause a substantially equal decrease in the value of electrical resistance determined between the electrodes 12 and 13. This is because the effect of the mass 17 depends not only upon the electrical properties of the mass but also on the position of the mass relative to the electrode position.

In FIG. 1 there is illustrated the four electrode positions of the Wenner electrode arrangement, the current electrode positions being indicated by the letter C and the potential electrode positions being indicated by the letter P. At the surface of the ground in the vicinity of the electrode positions, there are five zones indicated by the references Z1 to Z5. The zones Z2 and Z4 have a character different from that of the zones Z1, Z3 and Z5. As can be seen from FIG. 1, what appears at the surface of the ground to be three zones Z1, Z3 and Z5 are, in fact, merged with each other below the zones Z2 and Z4. The boundary of the zone Z2 is indicated by the reference number 2 and the boundary of the zone Z4 is indicated by the reference number 4. A mass which has a positive effect on the electrical resistance determined, when the mass is situated in either the zone Z2 or the zone Z4, will have an opposite effect on the value of electrical resistance determined with the same electrode arrangement if the mass is situated in one of the zones Z1, Z3 and Z5.

Further resistance values, determined with different electrode spacings, are required to enable an apparent resistivity/electrode spacing curve to be plotted. For this purpose, further electrodes are implanted in the ground on the straight line on which the electrodes 10 to 14 are implanted. The arrangement of six further electrodes, 18 to 23, together with the electrodes 10 to 14, is illustrated in FIG. 3. The spacing of successive electrodes in each direction from the central electrode 12 forms a geometrical progression $a$ $2a$, $4a$, $8a$ and $16a$. This arrangement enables a series of determinations of the offset Wenner resistance to be made with electrode spacings of $2a$, $4a$ and $8a$. For the determination with electrode spacing $2a$, the electrodes 18, 10, 12, 14 and 21 are used. For the determination with electrode spacing 4a, the electrodes 19, 18, 12, 21, 22 are used. In this way, offset Wenner resistances R(a), R(2a), R(4a) and R(8a) are obtained with electrode spacings a, 2a, 4a and 8a respectively.

Further information which is useful in the preparation of an apparent resistivity/electrode spacing curve can be obtained using different arrangements of four of the five electrodes 10 to 14. A total of 15 essentially different arrangements of four electrodes are possible, each giving rise to a different resistance measurement. FIG. 4 illustrates these electrode arrangements and resistance measurements. Since many of the resistances are inter-related, it is only necessary to measure the two resistances $R_B$ and $R_C$ at each electrode spacing to provide enough information to enable further points on the apparent resistivity/electrode spacing curve to be computed. These points may be computed, for example, from the relation $$R(3a) = \tfrac{1}{2}R_D(2a) + R_B(2a) - R_B(a) + \tfrac{1}{2}R_D(4a)$$

Other relations also exist.

Thus with electrode spacings a, 2a, 4a 8a etc. offset Wenner resistances R(a), R(2a), R(3a), R(4a), R(6a), R(8a), R(12a), etc., may be determined.

It is preferred that all of the electrodes should be implanted in the ground before any measurements are made, each electrode being connected by a respective conductor to the control box 15. To this end, the multi-core cable 16 may extend along the entire row of electrodes.

The respective terminals T1 to T5 of the conductors comprised by the cable 16 are mounted on a common support 24 in the control box 15 and this box is conveniently positioned close to the middle electrode 12, so that the positions of the terminals is substantially the same as that of the electrode 12. The cable is fitted with taps at positions along its length corresponding to the required positions of the electrodes so that if the cable is extended that is uncoiled or unfolded from a coiled or folded configuration so as to present two substantially straight lengths in opposite directions from the control box and an electrode is then driven into the ground adjacent to each tap will have become moved from a position near the electrode 12 in consequence of the extending of the cable 16 to a position determined by its position along the cable from the support 24 and terminals T1 and T5 and each tap, the electrode spacings indicated in FIG. 3 will be established. Each tap is adapted to provide an electrical connection between an electrode and a respective one of the conductors in the cable. It will be seen that the respective lengths of the conductors from the terminals to the taps, in one direction from the control box form a geometric progression a, 2a, 4a, 8a and 16a.

To enable determinations of electrical resistance to be made with electrode arrangements other than Wenner electrode arrangements, without moving any of the electrodes 10 to 14 which have been implanted in the ground, the multi-pole switch of the control box 15 may be a four-pole, five-way switch as illustrated in FIG. 5. Inputs of the switch are connected in the manner shown in FIG. 5 to terminals T1 to T5 which, in turn, are connected by respective conductors of the cable 16 to the electrodes 10 to 14 through taps t10 to t14. Each pole of the switch has a common output indicated in FIG. 5 by the references P1, P2, C1 and C2. The outputs P1 and P2 are connected to the potential difference measuring means and the outputs C1 and C2 are connected to the source of electric current provided in an electrical measuring instrument 25. The five electrode arrangements for which the resistance can be determined by setting the switch to five different positions, without moving the electrodes which have been implanted in the ground, are illustrated in the following Tablw where C1 and C2 represent electrodes used as current electrodes, that is the electrodes between which current flows through the ground and P1 and P2 represent electrodes used as potential electrodes, that is, electrodes between which the potential difference is measured. It will be appreciated that the five electrode arrangements represented in the following Table also appear in FIG. 4 of the accompanying drawings.

| Electrode arrangement/ | Electrode | | | | |
| Switch position. | 10 | 11 | 12 | 13 | 14 |
|---|---|---|---|---|---|
| 1 | C1 | P1 |    | P2 | C2 |
| 2 | C1 | P1 |    | C2 | P2 |
| 3 | C1 | P1 | P2 | C2 |    |
| 4 |    | C1 | P2 | P1 | C2 |
| 5 | C1 | C2 |    | P1 | P2 |

Although the Wenner electrode arrangement is used in the particular example of an electrical resistivity method in accodance with the invention which is illustrated in FIG. 2, other electrode arrangements may be used in other electrical resistivity methods in accordance with the invention. In the particular method illustrated in FIG. 2, the effect of a local resistivity variation in a zone of one character is substantially equal and opposite to the effect of the same variation in a zone of opposite character. With other electrode arrangements, the effect may be unequal and in such cases the pair of electrical resistance values which are determined during performance of the method are combined in an appropriate manner other than calculating the average of the values. It will also be understood that, although in the particular method illustrated in FIG. 2, each one of the four electrode positions is changed, the invention embraces methods wherein less than all of the electrode positions are changed.

I claim:

1. In or for apparatus for investigating the electrical resistivity of the ground comprising a plurality of electrodes for ground implantation at respective electrode positions spaced apart along a line, a source of electrical current, and measuring means for measuring electrical current and potential between respective pairs of the electrodes, the improvement comprising two sets of insulated electrical conductors for connecting said electrodes to said measuring means, each conductor having a respective terminal for connection to said measuring means and a respective tap for connection to a respective one of said electrodes, and a support on which said terminals are mounted adjacent to each other, the taps being movable away from the support upon extension of said conductors along said line, and, in each of the sets, the respective lengths of the conductors from the terminals to the taps varying from one conductor to another and forming substantially a geometric progression when the conductors are in their extended positions.

2. The improvement according to claim 1 further including a multi-pole multi-way electrical switch associated with the support and having inputs connected to the terminals of the conductors and outputs connected to the source of electrical current and to potential difference measuring means.

3. A method of investigating the electrical resistivity of the ground wherein, by means of ground contacting electrodes arranged in a linear array defining successive zones between them an electrical current is passed into the ground between a pair of the electrodes, and a potential difference is measured between another pair of the electrodes, the contribution to the measured resistivity being respectively positive and negative in successive zones, and a change is then made in the mode of use, namely passage of current or potential measured at certain at least of the electrode positions and a longitudinal shift is effected in the length covered by the zones in use to establish positive and negative contributions where formerly there were respectively negative and positive contributions in a sufficient number of the zones situated in the overlap between the two lengths to eliminate or substantially reduce the effect of resistivity variations local to any one of the zones.

4. A method of investigating the electrical resistivity of the ground wherein, using an array of electrodes at electrode positions spaced apart along a straight line at equal intervals, current is passed into the ground between a pair of the electrodes and potential difference is measured between another pair of the electrodes to provide data for a first determination of resistivity, and, a change is made in that in providing data for a further determination of resistivity, a shift takes place of one interval along the line and in the same direction of the operation formerly performed at each electrode position bringing into use a further electrode position at one end of the array, and discarding use of an electrode position at the other end of the array.

5. A method according to claim 4 wherein the array contains five electrodes, a first group of four of the electrodes is used in providing data for the first determination of resistivity and then a second group of four of the electrodes is used in providing data for the further determination of resistivity, the first group of electrodes excluding that one of the electrodes at one end of the array and the second group of electrodes exclusing that one of the electrodes at the opposite end of the array.

6. A method according to claim 5, or claim 3, or claim 4 wherein there is computed the mean of two measurements made, one before said change and one after said change.

7. A method of investigating the electrical resistivity of the ground comprising:
positioning plural ground contacting electrodes in a linear array so as to define successive zones between them;
passing an electric current through the ground between a first pair of electrodes of a first group of at least four electrodes of the array and measuring the resulting potential difference between a second pair of electrodes of the first group, the successive zones being defined such that the effect on the measured potential difference due to a local resistivity variation is respectively positive and negative in successive zones;
selecting a second group of at least four electrodes, including at least one electrode in the first group so that at least one zone defined by the first group is in common with a zone defined by the second group;
passing an electric current through the ground between a first pair of electrodes of the second group and measuring the resulting potential difference between a second pair of electrodes of the second group, the second group of electrodes being selected such that the effect on the measured potential difference resulting from the local resistivity variation is opposite to the effect during measurements with the first group of electrodes so that when the measurements are combined the effect of the local resistivity variation on the measurements is substantially reduced.

8. A method of investigating the electrical resistivity of the ground comprising:
positioning an array of at least five electrodes at electrode positions spaced at equal intervals apart along a straignt line;
selecting a first group of four equally spaced electrodes from the array;
passing an electric current into the ground between a first pair of electrodes of the first group and measuring the resulting potential difference between a second pair of electrodes of the first group to provide data for a first determination of resistivity;
selecting a second group of four electrodes from the array with each electrode of the second group shifted along the line in a common direction by one interval from a corresponding electrode in the first group;
passing an electric current into the ground between a first pair of electrodes of the second group corresponding to the first pair of electrodes of the first group and measuring the resulting potential difference between a second pair of electrodes of the second group corresponding to the second pair of electrodes of the first group to provide data for a second determination of resistivity.

9. A method according to claim 7 including the step of combining the measurements to produce a mean of the two measurements.

10. A method according to claim 8 including the steps of making a first determination of resistivity, making a second determination of resistivity and obtaining the mean of the two determinations of resistivity.

* * * * *

UNITED STATES PATENT AND TRADEMARK OFFICE
CERTIFICATE OF CORRECTION

PATENT NO. : 4,246,538
DATED : January 20, 1981
INVENTOR(S) : RONALD D. BARKER

It is certified that error appears in the above-identified patent and that said Letters Patent are hereby corrected as shown below:

Column 1, line 38, "variations" should be --variation--;

Column 1, line 20, "resistance" should be --resistances--;

Column 5, lines 43 through 47, following "to each tap" (line 43) delete "will have become moved from a position near the electrode 12 in consequence of the extending of the cable 16 to a position determined by its position along the cable from the support 24 and terminals T1 and T5 and each tap";

line 48, following "each tap" insert --will have become moved from a position near the electrode 12 in consequence of the extending of the cable 16 to a position determined by its position along the cable from the support 24 and terminals T1 and T5 and each tap--;

UNITED STATES PATENT AND TRADEMARK OFFICE
CERTIFICATE OF CORRECTION

PATENT NO. : 4,246,538
DATED : January 20, 1981
INVENTOR(S) : RONALD D. BARKER

It is certified that error appears in the above-identified patent and that said Letters Patent are hereby corrected as shown below:

Column 6, line 7, "Tablw" should be --Table--;

line 27, "accodance" should be --accordance--;

Column 8, line 28, "straignt" should be --straight--.

Signed and Sealed this

Twelfth Day of May 1981

[SEAL]

Attest:

RENE D. TEGTMEYER

Attesting Officer     Acting Commissioner of Patents and Trademarks

UNITED STATES PATENT AND TRADEMARK OFFICE
CERTIFICATE OF CORRECTION

PATENT NO. : 4,246,533
DATED : January 20, 1981
INVENTOR(S) : RONALD D. BARKER

It is certified that error appears in the above-identified patent and that said Letters Patent are hereby corrected as shown below:

Foreign Application Priority Data:

"Feb. 10, 1977 (GB)" should be --October 29, 1977 (GB)--

Insert after the "Abstract" the following:

--Claim to Priority

Applicant claims the right of priority under 35 U.S.C. §119 on the basis of British Patent Application Serial No. 45,147, filed October 29, 1977.--

Signed and Sealed this

Twenty-fifth Day of August 1981

[SEAL]

Attest:

GERALD J. MOSSINGHOFF

Attesting Officer

Commissioner of Patents and Trademarks